(12) United States Patent
Robinson

(10) Patent No.: US 7,772,487 B1
(45) Date of Patent: Aug. 10, 2010

(54) PHOTOVOLTAIC CELL WITH ENHANCED ENERGY TRANSFER

(75) Inventor: Matthew R. Robinson, East Palo Alto, CA (US)

(73) Assignee: Nanosolar, Inc., San Jose, CA (US)

( * ) Notice: Subject to any disclaimer, the term of this patent is extended or adjusted under 35 U.S.C. 154(b) by 1038 days.

(21) Appl. No.: 10/966,338

(22) Filed: Oct. 16, 2004

(51) Int. Cl.
*H01L 31/00* (2006.01)

(52) U.S. Cl. ....................... 136/263; 136/243

(58) Field of Classification Search ............ 136/263; 438/48
See application file for complete search history.

(56) References Cited

U.S. PATENT DOCUMENTS

| | | | |
|---|---|---|---|
| 5,350,459 A * | 9/1994 | Suzuki et al. ............... | 136/263 |
| 5,482,570 A | 1/1996 | Saurer et al. ................ | 136/255 |
| 5,525,440 A | 6/1996 | Kay et al. ................... | 429/111 |
| 5,571,612 A | 11/1996 | Motohiro et al. ............ | 428/323 |
| 6,270,846 B1 | 8/2001 | Brinker et al. ............. | 427/385.5 |
| 6,278,056 B1 | 8/2001 | Sugihara et al. ............ | 136/263 |
| 6,291,763 B1 | 9/2001 | Nakamura .................. | 136/256 |
| 6,340,789 B1 | 1/2002 | Petritsch et al. ............ | 136/263 |
| 6,812,638 B2 * | 11/2004 | Wakimoto et al. .......... | 313/505 |
| 6,946,597 B2 | 9/2005 | Sager et al. ................. | 136/263 |
| 6,987,071 B1 | 1/2006 | Bollman et al. ............. | 438/780 |
| 7,227,066 B1 | 6/2007 | Rocheisen et al. ........... | 257/40 |
| 7,253,017 B1 | 8/2007 | Roscheisen et al. .......... | 438/57 |
| 2001/0031509 A1* | 10/2001 | Yamazaki .................... | 438/48 |
| 2002/0017656 A1 | 2/2002 | Graetzel et al. ............. | 257/184 |
| 2002/0134426 A1 | 9/2002 | Chiba et al. ................. | 136/263 |
| 2002/0185173 A1* | 12/2002 | Lindsey et al. .............. | 136/263 |
| 2002/0189666 A1* | 12/2002 | Forrest et al. ............... | 136/263 |
| 2002/0192441 A1 | 12/2002 | Kalkan et al. ............... | 428/209 |
| 2003/0226498 A1 | 12/2003 | Alivisatos et al. ........... | 117/84 |
| 2004/0084080 A1 | 5/2004 | Sager et al. ................. | 136/263 |
| 2004/0118448 A1 | 6/2004 | Scher et al. ................. | 136/252 |
| 2004/0250848 A1 | 12/2004 | Sager et al. ................. | 136/252 |
| 2005/0095422 A1 | 5/2005 | Sager et al. ................. | 428/336 |
| 2005/0098204 A1 | 5/2005 | Roscheisen et al. ......... | 136/263 |

(Continued)

FOREIGN PATENT DOCUMENTS

DE 2741954 3/1979

(Continued)

OTHER PUBLICATIONS

Treece et al., p. 175, ("Applying combinatorial chemistry methodology to optimizing the growth of indium tin oxide on polymeric substrates", Society of Vaccum Coaters 43rd Anuual Technical Conference Proceedings, Apr. 15-20, 2000, copyright 2000 Society of Vacuum Coater, pp. 171-175).*

(Continued)

*Primary Examiner*—Alexa D Neckel
*Assistant Examiner*—Miriam Berdichevsky

(57) ABSTRACT

A photovoltaic apparatus may comprise two or more energy transfer layers and an acceptor layer. The energy transfer layers are configured such that excitons formed by absorption of radiation in one energy transfer layer transfer to an adjacent energy transfer layer that is closer to the acceptor layer by a dipole mechanism without the exciton diffusing to an interface between the two energy transfer layers. This can be achieved by appropriately configuring the HOMO and LUMO (or conduction and valence band) levels of the energy transfer layers and the acceptor layer.

20 Claims, 4 Drawing Sheets

U.S. PATENT DOCUMENTS

2005/0098205 A1    5/2005    Roscheisen ................ 136/263

FOREIGN PATENT DOCUMENTS

| EP | 1028475 A1 | 8/2000 |
|---|---|---|
| EP | 1087446 A2 | 3/2001 |
| WO | WO 02/084708 | 10/2002 |

OTHER PUBLICATIONS

Sandalphon et al., p. 400-second paragraph ("Advanced organic material for optoelectronic integrated devices, interconnects, and packaging, Science and Technology of Polymers and Advanced Materials", Plenum Press New York, 1998, p. 400-401).*

Drummond et al., p. 2, results and discussion, "Conductive polymer films for improved poling in non-linear optical waveguides", Antec Plastice: Plastics on my Mind vol. 2, © 1998 Society of Plastics Engineers, p. 1-5.*

Inganas and Zhang, (edited by Iwamoto, Kaneto, Mashiko), Nanotechnology and nano-interface controlled electronic devices, Feb. 3, 2003, Elservier, 1st, 66-68, 73-75 and 79.*

Halls, Santos, Cornil, Silbey, Hwang, Holmes, Bredas, Friend, Charge and energy transfer processes at polymer/polymer interfaces: a joint experimental and theoretical study, Aug. 15, 1999, Physical Review B, 60 (8), 5721-5727.*

Greenham, Peng, Alivisatos, Charge separation and transport in conjugated polymer/semiconductor nanocrystal composites studied by photoluminescence quenching and photoconductivity, Dec. 15, 1996, Physical Review B, 54 (24), 17628-17636.*

M. R. Robinson et al, "Reduced Operating Voltages in Polymer Light-emitting Diodes Doped with Rare-earth Complexes" *Advanced Materials*. 15, No. 18, Sep. 2003, pp. 1547-1551.

Definition of Förster Excitation Transfer, IUPAC Compendium of Chemical Terminology 2nd Edition (1997).

A. Dogariu et al. "Time resolved Förster energy transfer in polymer blends" *Synthetic Metals* 100, pp. 95-100 (1999).

B U Barshchevskii, "Exciton photochemistry of light-sensitive crystals", *Physics—Uspekhi* 44 (4) pp. 397-414 (2001).

M. Pawlowska, W. Wojciechowski "Review of luminescence and magnetic properties of antiferromagnetic $KMnCl_3$, $RbMnCl_3$, $TlMnCl_3$ and $(C_nH_{2n+1}NH_3)2MnCl_4$ ($n$= 1, 2)" *Materials Science*, vol. 20, No. 1, 2002.

Masanobu Iwanaga et al., "Self-trapped electrons and holes in $PbBr_2$ crystals" Physical Review B, vol. 65, 214306, Jun. 10, 2002, pp. 1-8.

A. A. Shoustikov et al., "Electroluminescence Color Tuning by Dye Doping in Organic Light Emitting Diodes", IEEE Journal of Selected Topics in Quantum Electronics, vol. 4, No. 1, Jan./Feb. 1998, pp. 3-13.

G.F.J. Garlick, "Recombination emission in inorganic solids" *Rep. Prog. Phys.* 30, Part II, (1967) pp. 491-560.

*Advances in Organic Light-Emitting Diode Materials*, Dissertation (Ph.D.)—University of California Santa Barbara 2003, Chapter 4: Polymer Host / Guest Blends and electrophosphorescence.

*Advances in Organic Light-Emitting Diode Materials*, Dissertation (Ph.D.)—University of California Santa Barbara 2003, Chapter 5: Reduced Operating Voltages in Polymer Light-emitting Diodes Doped with Rare-earth Complexes: Energy Transfer versus Charge Trapping.

Murphy, A. R.; Frechet, J. M. J.; Chang, P.; Lee, J.; Subramanian, V.; "Organic Thin Film Transistors from a Soluble Oligothiophene Derivative Containing Thermally Removable Solubilizing Groups"*J. Am. Chem. Soc.* 2004, 126, pp. 1596-1597.

\* cited by examiner

US 7,772,487 B1

PHOTOVOLTAIC CELL WITH ENHANCED ENERGY TRANSFER

STATEMENT REGARDING FEDERALLY SPONSORED RESEARCH OR DEVELOPMENT

The present invention was supported in part by grant number FA8650-04-2-6474 from the U.S. Air Force Research Laboratory. The Government has certain rights in this invention.

FIELD OF THE INVENTION

The present invention relates to photovoltaic devices and more specifically to enhancing useful absorbance in absorbing layers for photovoltaic devices by exploiting energy transfer.

BACKGROUND OF THE INVENTION

Photovoltaic devices typically have one or more layers of photoactive material sandwiched between two electrodes. Typically, one of the electrodes is transparent. The layers of photoactive material typically exhibit complementary charge transfer properties (e.g., one is an electron accepting/transporting material and the other is a hole-accepting/transporting material). At least one of the two materials is a light-absorbing material. In an organic solar cell, radiation absorbed by the photoactive layers creates an exciton (an electron-hole pair). Depending on the material, the electron-hole pair can only travel a short distance (on the order of several nm) before spontaneous recombination occurs. If, however, the electron-hole pair can reach a junction with differential electron affinity prior to recombination, then charge splitting can occur, upon which the split charges (holes and electrons) can move through the two different materials such that electrons are collected at one electrode and holes are collected at the other. The relatively short exciton diffusion length of many materials defines the scale at which a nanostructured charge-splitting network should be constructed.

Recently, organic materials, such as gels, conjugated polymers, molecules, and oligomers, have been used as photoactive materials. Layers of these materials can be easily deposited using standard polymer processing techniques.

Both organic and inorganic materials can be used to absorb light in the solar active layer, either singly, or in combination. To increase the efficiency of photovoltaic devices made with such materials, it is desirable to increase the absorbance in the solar cell active layer. To do so, a sufficiently large bulk volume must be positioned within the solar cell that is capable of absorbing most of the incoming light. However, since the absorbance coefficients of many organic and/or inorganic materials is not high, depositing a significant volume of material into a charge splitting network can significantly increase the distance through which charges must migrate, resulting in greater spontaneous recombination events prior to charge splitting, and lowering the charge collection efficiency of the solar cell. Although the exciton diffusion length is a property of a particular material, and can be altered as that material structure is modified, the potential range of tunability of the exciton diffusion length is nevertheless limited.

With or without nanostructuring, and even with chemically tuned materials, the performance of prior art PV cells is often sub-optimal for additional reasons. For example, many photoactive materials absorb light only over a fairly narrow band of wavelengths. It would be desirable for the active layer to absorb light over a broader range of wavelengths than is currently available in a single material. One way to do this is to use layers of different absorbing materials with overlapping absorption bands in the active layer. Although this can broaden the effective absorption band, aggregated layers of materials can still incur the problem of a larger than desired bulk volume in the active layer, leading again to undesired exciton recombination. To overcome this each absorbing layer may be relatively thin, i.e., less than or equal to the corresponding exciton diffusion distance. Although making such thin absorbing layers can enhance exciton transfer it can also reduce light absorption and exciton generation.

Thus, there is a need in the art, for a photovoltaic apparatus that is both highly efficient at absorbing light and highly efficient at transferring excitons to a charge-splitting interface prior to charge recombination. There is also a need in the art for a method for making such an apparatus.

BRIEF DESCRIPTION OF THE DRAWINGS

The teachings of the present invention can be readily understood by considering the following detailed description in conjunction with the accompanying drawings, in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Introduction

Embodiments of the present invention provide for enhanced efficiency of light absorption and exciton transfer in active layers that can be non-nanostructured. Embodiments of the present invention overcome the low exciton diffusion length of typical light absorbing materials, which is a major limitation of organic, inorganic, and hybrid organic/inorganic multi-layer photovoltaic cells. This is done by taking advantage of Förster energy transfer of excitons formed in one layer of light absorbing material to adjacent layers over distances much greater than the exciton diffusion distance in the light absorbing material. For example, in certain materials, excitons may be transferred over distances as large as 50 nm (20-30 nm is more typical) in a tandem fashion ultimately leading to a splitting interface. In this way all excitons may be harvested from a light-absorbing layer of any thickness. This process does not require excitons to travel to the next interface. Instead, the excitons are transferred from one layer to the next via a dipole-dipole mechanism. This greatly reduces the need to develop improved bulk heterojunctions and/or nanostructured exciton-splitting interfaces.

Embodiments of the invention may have overlapping principles with the tandem cascading level cell idea but is a distinguishable and superior approach in the following way. The component layers of cells fabricated according to embodiments of the present invention can be much thicker than prior art tandem cascading level cells. In prior art tandem cells each layer needs to have a thickness on the order of the exciton diffusion length of the light absorbing material, e.g. a polymer (typically <10 nm) in order to harvest all of the excitons. In order to build up a cell with sufficient absorbance with such a requirement, the cell must have more than about 10 layers. In embodiments of the present invention, by contrast, when the requirements for successive Förster energy transfer are satisfied, the layers can be much thicker, e.g., up to about 60 nm thick, allowing in the ideal case a tri-layer or other multi-layer device.

Figure 1:
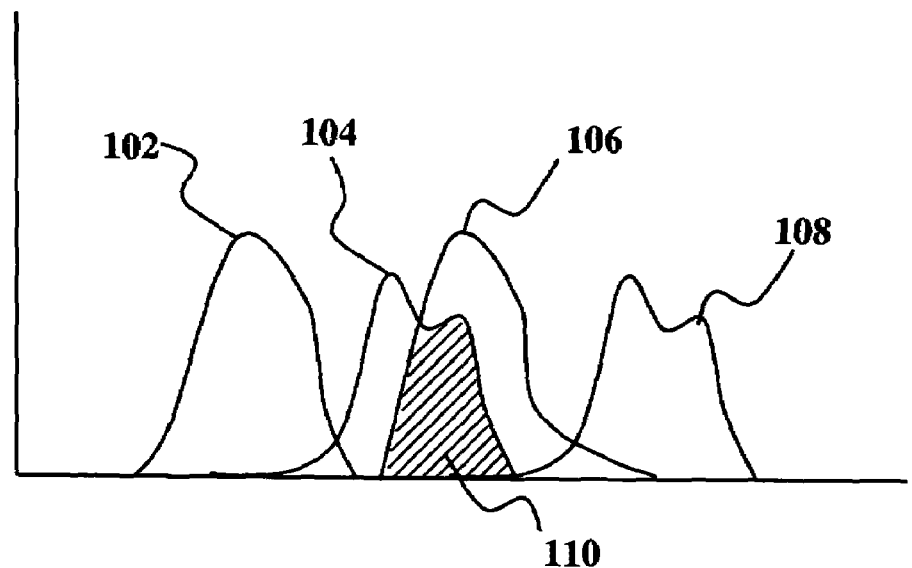
FIG. 1 is a set of spectra illustrating the principle of Förster energy transfer.

Förster energy transfer is a non-radiative energy transfer mechanism that is mediated by dipole-dipole interactions. The spectral diagram of FIG. 1 illustrates one of the principles behind Förster energy transfer. A donor photoactive material may be characterized by a donor absorption band 102 and a donor emission band 104. The donor absorption band 102 represents a range of photon energies for which the donor material absorbs radiation to produce excitons. The emission band 104 represents a range of photon energies that may be emitted by the donor material. Similarly, an acceptor photoactive material may be characterized by an acceptor absorption band 106 and an acceptor emission band 108. In order for Förster energy transfer to take place between the donor and acceptor materials there must be a sufficient overlap 110 between the donor emission band 104 and the acceptor absorption band 106. The rate of Förster energy transfer $k_{FET}$ from the a donor molecule to an acceptor molecule may be approximated as:

$$k_{FET} \sim J*R^{-6}*\kappa$$

where J is an overlap integral dependent on the overlap 110 between the donor emission spectrum 104 acceptor absorption spectrum 106. R is the distance between the donor and the acceptor materials, and $\kappa$ is a measure of the relative orientation of dipoles between the donor and acceptor. For random orientation $\kappa$ is about 0.67 and for perfectly oriented dipoles $\kappa$ is equal to 1.0. In order for Förster energy transfer to be efficient, the distance between an acceptor molecule and the nearest donor molecule must be sufficiently small yet typically larger than the exciton diffusion length. The rate of Förster energy transfer is inversely proportional to the host-guest separation distance (R) to the sixth power ($R^6$). Where the donor and acceptor materials are arranged in separate but adjacent layers, the rate of Förster energy transfer depends on the thickness of the layers.

Figure 2:
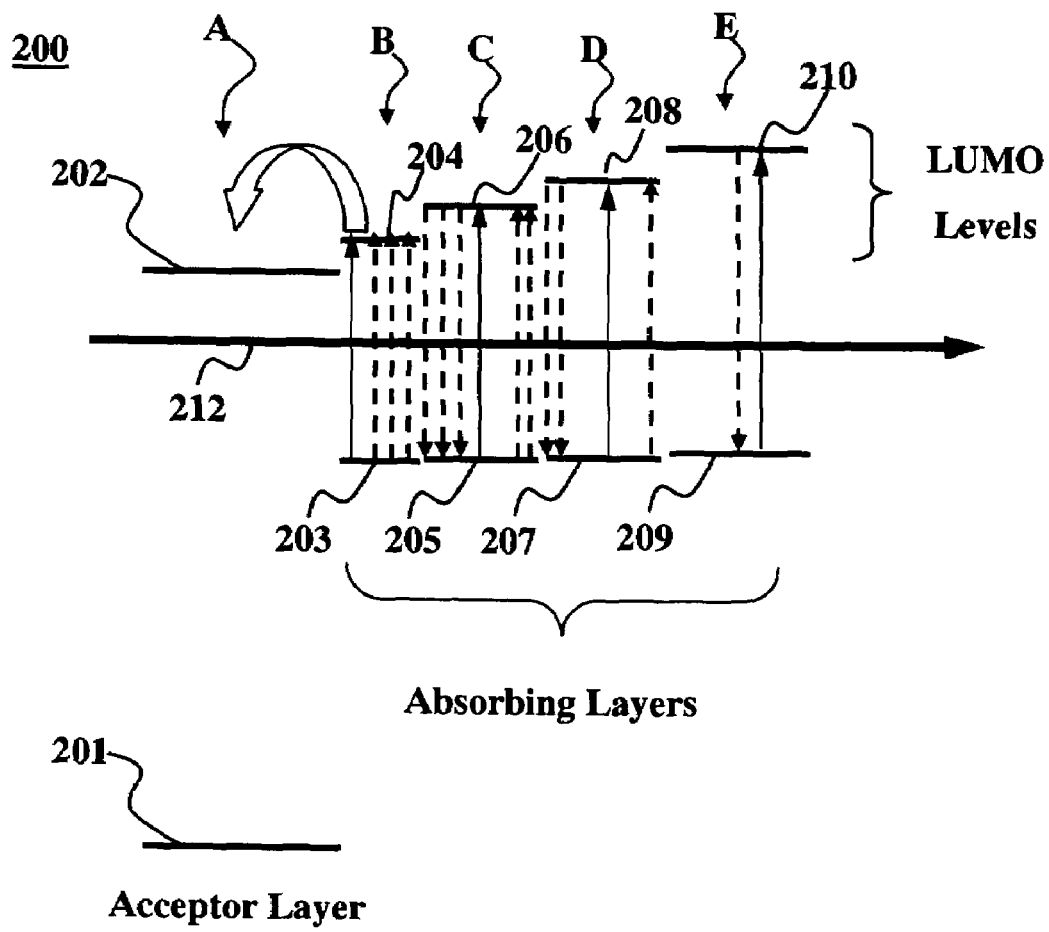
FIG. 2 is an energy level diagram illustrating the principle of Förster energy transfer.

FIG. 2 is an electron energy level diagram illustrating electronic energy levels for a photovoltaic apparatus 200 according to an embodiment of the present invention. The apparatus includes an acceptor layer A and two or more energy transfer layers, e.g., four layers B, C, D, E. Adjacent energy transfer layers are characterized by spectral overlap that favors Förster energy transfer of excitons toward the acceptor layer. In addition to spectral overlap, the energy transfer layers C, D, E typically have light absorbing and exciton generating properties. The energy transfer layer B that is adjacent the acceptor layer A, need not have light absorbing and exciton generating properties. Although four energy transfer layers are shown in FIG. 2 for the sake of example, two, three, or more layers may be used without departing from the scope of these teachings. The acceptor layer A is characterized by a highest occupied molecular orbital (HOMO) level or valence band 201 and a lowest unoccupied molecular orbital (LUMO) level or conduction band 202. The HOMO and LUMO levels are sometimes respectively referred to as the top of the conduction band and the bottom of the valence band, especially for inorganic materials.

Note that if there is spectral overlap between adjacent layers, the energy levels will be arranged such that Förster energy transfer can take place. The placement of energy levels is FIG. 2 is constrained by other factors characteristic of a 2D photovoltaic cell. Specifically, if the energy transfer layers are layered on top of one another holes and electrons originating at a given interface between energy transfer layers must travel through intervening layers to get out of the device. Cascading the energy levels, e.g., as shown in FIG. 2, allows them to do so.

The energy transfer layers B, C, D, E are respectively characterized by HOMO levels 203, 205, 207, 209 and corresponding LUMO levels 204, 206, 208, 210. The configuration of the HOMO and LUMO levels is often important so that holes or electrons (generated either directly or by energy transfer) can get out of the absorbing layers B, C, D, and E to an electrode. In the apparatus 200, the HOMO levels 203, 205, 207, 209 cascade such that each HOMO level is higher than the next lowest HOMO level (i.e., the level for the adjacent layer on the side closer to the acceptor layer A). The HOMO level 203 for the lowest energy transfer layer B is sufficiently greater than the HOMO level 201 for the acceptor layer A such that exciton splitting can take place at the interface between these two layers. Except for the lowest energy transfer layer B, i.e., the one adjacent the acceptor level, each absorbing layer may have a HOMO level that is greater than or equal to the preceding HOMO level. Starting with the lowest energy transfer layer B, the bandgap (i.e., the difference between the LUMO and HOMO levels) for each energy transfer layer is less than the bandgap of the next higher absorbing layer. If the HOMO levels 203, 205, 207, 209 don't cascade up to the electrode holes will be trapped—so they have to be close (within a few kT of each other). Because Förster energy transfer requires spectral overlap energy transfer will generally happen to a material with a lower bandgap. Thus, if the HOMO levels are the same or higher as one goes from left to right in FIG. 2 then in order to satisfy the bandgap requirement the LUMO levels 204, 206, 208, 210 cascade upward as well. The differences in the LUMO levels can be relatively small, e.g., about 0.1 eV. For significant spectral overlap the difference between adjacent LUMO levels is on the order of 0.5 eV per layer for typical organic materials.

Since Förster energy transfer can take place over distances greater than the exciton diffusion distance, the higher energy transfer layers C, D, and E may be relatively thick, i.e., thicker than the exciton diffusion distances in these layers. The higher layers C, D, and E may be up to 50 nm depending on the spectral overlap and orientation factor. Note that Förster energy transfer need not, and preferably does not, take place between the lowest energy transfer layer B and the acceptor layer A. Consequently, the lowest energy transfer layer B generally has a relatively lower thickness, i.e., on the order of the exciton diffusion distance (typically about 10 nm) in the lowest energy transfer layer B. This way excitons that reach the lowest energy transfer layer B have a high probability of diffusing to the splitting interface with the acceptor layer A. Furthermore, because the lowest energy transfer layer is relatively thin, it doesn't need to be a good light absorbing and exciton generating material, though these properties are generally desirable.

When the energy levels are configured in this way, excitons may be transferred from the higher energy transfer layers C, D, E, toward the lowest energy transfer layer B by Förster energy transfer. These excitons are then split at the interface between the lowest energy transfer layer B and the acceptor layer A. Excitons will also be split throughout the apparatus 200 at interfaces between adjacent energy transfer layers due to the tandem cascading LUMO levels. The advantage to the apparatus 200 is that excitons that are too far away from an interface (i.e., more than an exciton diffusion length) will be transferred via a dipole mechanism (Förster energy transfer) to the next layer without having to diffuse to the next interface.

Radiation 212 may be absorbed at each of the energy transfer layers B, C, D, E by promoting an electron from the HOMO level to the corresponding LUMO level to produce an exciton. Such absorption is indicated by the upward pointing solid arrows. The above-described configuration of the LUMO and HOMO energy levels gives layers B, C, D, E different absorption bands. If the difference between adjacent LUMO levels is not too great there will be sufficient overlap between the emission band of a given layer and the absorption band of the next lowest layer. The exciton and its energy may then transfer to the next lowest absorbing layer by Förster energy transfer. Förster energy transfer from layer E to layer D is represented by a downward pointing dashed arrow in the layer E and a corresponding upward pointing dashed arrow in adjacent lower layer D. Note that layer D can transfer to layer C excitons that are received from layer E and excitons generated in layer D by absorption of radiation 212. These energy transfers are indicted by the pairs of downward pointing dashed arrows in layer D and the corresponding pairs of upward pointing dashed arrows in layer C. Similarly, layer C can transfer to layer B the excitons initially generated by absorption in layers D and E and any excitons generated in layer B by absorption of radiation 212. Consequently, excitons generated in all four absorbing layers B, C, D, E can be split at the interface between the lowest energy transfer layer B and the acceptor layer A. The cascading of the HOMO and LUMO levels assures that electrons and holes from the split excitons will c be able to travel out of the absorbing layers and into adjacent electrodes.

Embodiments of the present invention allow for fabrication of multi-layer heterojunction photovoltaic cells without nanostructuring the dissociation interface or using a bulk heterojunction while using layer thicknesses greater than the exciton diffusion length of the light absorbing material e.g. a polymer or inorganic material while still converting each absorbed photon into photocurrent. The upper energy transfer layers C, D, E may range in thickness from about 10 nm to about 60 nm. Given that it takes a total absorber thickness of about 100 nm to absorb all photons for certain light-absorbing polymers, an ideal case would give a cell with 100% conversion efficiency with a simple "2D" tri-layer structure.

Figure 3:
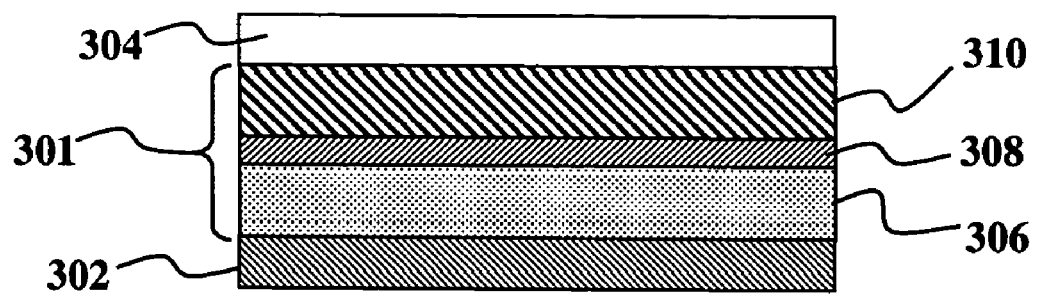
FIG. 3 is a cross-sectional schematic diagram of a photovoltaic device having a photovoltaic apparatus according to an embodiment of the present invention.

FIG. 3 illustrates the use of a tri-layer structure in a photovoltaic apparatus. The apparatus 300 generally includes an active layer 301 disposed between a base electrode 302 and a transparent electrode 304. The active layer 301 generally includes an acceptor layer 306, a first energy transfer layer 308, and a second energy transfer layer 310.

By way of example, the base electrode 302 may be made from a sheet material, e.g., a metal such as aluminum foil, titanium foil, stainless steel foil, molybdenum foil, foils made from metallic alloys, plastic foil, metallized plastic foil, and the like. The transparent electrode 304 may be made from a transparent conductive oxide (TCO) such as indium tin oxide (ITO) or zinc oxide (ZnO) or similar inorganic materials, or a conductive polymer such as PEDOT doped with polystyrene sulfonate (PSS) or similar organic materials, or combinations of these materials. The acceptor layer 306 may be an electron-accepting material, which may be either organic or inorganic. By way of example, the acceptor layer may be made of titanium oxide. The first energy transfer layer 308 may be made of any suitable organic or inorganic material that is compatible as a guest for Förster energy transfer from the second energy transfer layer 310. The first energy transfer layer 308 may also optionally have light absorbing and exciton generating properties. The second energy transfer layer 310 may be made of any suitable light absorbing semiconducting material that can support excitons and also act as a host for Förster energy transfer to the first energy transfer layer 308. Where the acceptor layer 306 is an electron-acceptor, the energy transfer layers 308, 310 are preferably electron donors and vice versa.

By way of example, the first and second energy transfer layers 308, 310 may be made of inorganic materials, e.g., quantum dots, nanocrystals, and/or thin films of binary, tertiary or quaternary semiconductors, or organic materials, e.g., dyes, pigments, small molecule compounds and/or polymers. Examples of suitable organic materials include but are not limited to conjugated polymers such as poly(phenylene) and derivatives thereof, poly(phenylene vinylene) and derivatives thereof (e.g., poly(2-methoxy-5-(2-ethyl-hexyloxy)-1,4-phenylene vinylene (MEH-PPV), poly(para-phenylene vinylene), (PPV)), PPV copolymers, poly(thiophene) and derivatives thereof (e.g., poly(3-octylthiophene-2,5,-diyl), regioregular, poly(3-octylthiophene-2,5,-diyl), regiorandom, Poly(3-hexylthiophene-2,5-diyl), regioregular, poly(3-hexylthiophene-2,5-diyl), regiorandom), poly(thienylenevinylene) and derivatives thereof, and poly(isothianaphthene) and derivatives thereof. Other suitable polymers include organometallic polymers, polymers containing perylene units, poly(squaraines) and their derivatives, and discotic liquid crystals. Other suitable organic materials include organic pigments or dyes, azo-dyes having azo chromophores (—N=N—) linking aromatic groups, phthalocyanines including metal-free phthalocyanine; (HPc), perylenes, perylene derivatives, Copper pthalocyanines (CuPc), Zinc pthalocyanines (ZnPc), naphthalocyanines, squaraines, merocyanines and their respective derivatives, poly(silanes), poly(germinates), 2,9-Di(pent-3-yl)-anthra[2,1,9-def:6,5,10-d'e'f']diisoquinoline-1,3,8,10-tetrone, and 2,9-Bis-(1-hexyl-hept-1-yl)-anthra [2,1,9-def:6,5,10-d'e'f']diisoquinoline-1,3,8,10-tetrone, pentacene, pentacene derivatives and/or pentacene precursors. The energy transfer layers 308, 310 may also include polyfluorenes and polyfluorene-based copolymers and blends, e.g. co-polymerized and/or blended with charge transporting (e.g. tri-phenyl-amines and derivatives) and/or light-absorbing compounds (e.g. fused thiophene rings and derivatives, generally hetero-atom ring compounds with or without substituents), pigments, dyes, and/or functionalized and/or non-functionalized fullerenes (either doped or undoped).

Examples of suitable inorganic materials for the energy transfer layers 308, 310 include but are not limited to Group IVA semiconductors, Group II-VI semiconductors, Group III-V semiconductors, Group IB-IIIA-VIA semiconductors, Group IV semiconductors, or alloys thereof. For example, suitable inorganic materials may be undoped or doped amorphous, crystalline, or poly-crystalline Si, Ga, CdSe, CdTe, InP, InAs, CdS, ZnS, ZnSe, ZnTe, HgTe, GaN, GaP, GaAs, GaSb, InSb, AlAs, AlSb, PbSe, PbS, PbTe, copper sulfide(s), CuInSe, CuInS, CuInSeS, CuInGaSe, CuInGaS, CuInGaSeS, CuInAlSe, CuInAlS, CuInAlSeS, alloys, blends, and mixtures thereof, and related materials.

Organic and/or inorganic materials may be deposited by suitable wet coating techniques, e.g., spin-, dip-, spray-, or roll-to-roll coating, printing techniques such as screen- flexographic, gravure, micro-gravure, and the like. Furthermore, organic and/or inorganic materials may be deposited by Meyer-bar coating, blade coating, self-assembly or electrostatic self-assembly techniques. Wet coating techniques may be preceded by modification of the underlying surface with a plasma, UV-ozone, surface agent, surfactant, adhesion-promoter or other treatment to assure good uniform thickness of the coating and/or uniform wetting of the structure with a uniform thickness film of the organic material, e.g., by creating a high surface energy, highly wetting surface. In addition, organic and/or inorganic material coatings may be prepared by non-solution based techniques, such as evaporation or sublimation of molecules thermal evaporation or, more preferably, organic vapor phase deposition. For purely inorganic materials, in addition to evaporation, additional deposition techniques include but are not limited to sputtering, atomic layer deposition, chemical vapor deposition physical vapor deposition, chemical bath deposition, electroplating, electroless deposition, and anodizaton.

In a preferred embodiment, the first and second absorbing layers are made of a polythiophene with one or more side groups that leave when heated. An example of such a polythiophene, referred to as PT127-2 is described, e.g., by Murphy, A. R.; Frechet, J. M. J.; Chang, P.; Lee, J.; Subramanian, V.; "Organic Thin Film Transistors from a Soluble Oligothiophene Derivative Containing Thermally Removable Solubilizing Groups" *J. Am. Chem. Soc.* 2004, 126, pp 1596-1597.

In the case of conjugated polymers, the desired HOMO/LUMO level structure of each energy transfer layer 308, 310 may be tuned by adding substituents to the polymers in the different layers. Such substituents include electron donating groups, which tend to raise the bandgap and steric groups, which tend to lower the bandgap. In the case of inorganic energy transfer layers, the bandgaps may be tuned by substitution with suitable atoms. Such materials can also be doped.

A photovoltaic apparatus of the type depicted in FIG. 3 may be fabricated according to embodiments of the present invention. Where the acceptor layer and energy transfer layers are polymers, there can be additional complications. Presently, there are only two methods for making an organic bi-layer photovoltaic device. For example, the energy transfer layers 308, 310 could be formed by a sequence of evaporation deposition of one or more of the conjugated polymers. Although effective, this is a relatively costly and complicated procedure. Alternatively, solution deposition could be used to form the energy transfer layers 308, 310 using polymer precursors dissolved in solvents. In principle, the first energy transfer layer 308 could be a polymer film formed using a first solution. Then the second energy transfer layer 310 could be formed on the first energy transfer layer 308 using a second solution. Unfortunately, it is often the case that the solvent used in the second solution tends to dissolve the first conjugated polymer film. Therefore it is desirable to deposit the second energy transfer layer 310 using a solvent that does not disrupt the first energy transfer layer 308 but still dissolves the precursor for the second energy transfer layer 310 while wetting the exposed surface of the first energy transfer layer 308. Although not impossible, it is extremely difficult to find a solvent that will wet an organic film without dissolving it. Fortunately, organic films deposited from solution can be annealed by exposure to a solvent vapor. The solvent vapor annealing renders the organic film insoluble even in the solvent of the solution from which it was deposited. This enables deposition of two or more organic films in sequence without having one deposition alter an underlying organic film. Solvent vapor annealing is described in U.S. patent application Ser. No. 10/719,040, which has been incorporated by reference.

Figure 4:
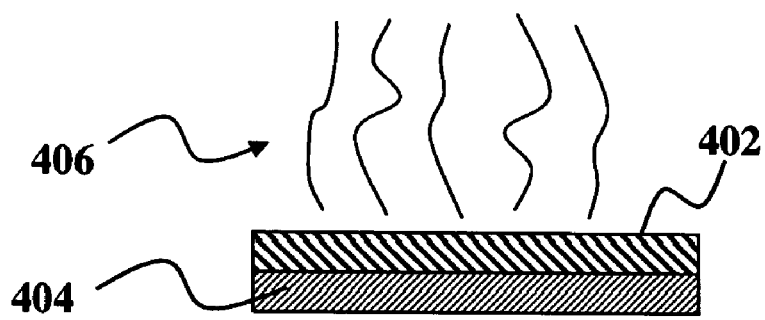
FIG. 4 is a cross-sectional schematic diagram illustrating solvent vapor annealing according to an embodiment of the present invention.

FIG. 4 illustrates the use of solvent vapor annealing in an embodiment of the present invention. In a partially fabricated photovoltaic apparatus an energy transfer layer 402 has been formed on a substrate 404 (e.g., an acceptor layer) by solution deposition. The energy transfer layer 402 is exposed to a solvent vapor 406. The energy transfer layer 402 can be a film of any suitable organic material, such as those listed above. Of particular interest are convertible conjugated polymers, i.e., conjugated polymers that can be converted from a soluble polymer to a dense insoluble film. Those of skill in the art will be familiar with suitable solvents capable of dissolving these materials and/or their precursors. The energy transfer layer 402 may be made using a convertible polymer that when converted tends to attract a second energy transfer layer.

Exposing the energy transfer layer 402 to the solvent vapor 406 anneals the energy transfer layer 402 without having to heat it. The energy transfer layer 402 can be exposed to the solvent vapor 406 by any suitable technique such as a flow tube or solvent vapor filled chamber. The exposure time needed to anneal the energy transfer layer 402 typically ranges from several minutes to several hours. The solvent vapor 406 can be a vapor of any suitable solvent. Examples of suitable solvents include, but are not limited to, acetone, chloroform, benzene, cyclohexane, dichloromethane, ethanol, diethyl ether, ethyl acetate, hexane, methanol, toluene, xylene, water vapor ($H_2O$), mixtures of two or more of these, and derivatives of one or more of these.

Other deposition mechanisms that remove the solubility concern and can even enhance the orientation factor κ are layer-by-layer self-assembly (using polyelectrolytes for example) and solvent vapor deposition. Layer by layer self-assembly commonly utilizes alternating depositions of materials with charged groups (especially polyelectrolytes) to build up a film. For example the surface of the substrate (or acceptor) is treated to have net negative charge. This surface is then brought into contact with a solution of the next material to be deposited which has either been modified to contain positively charged groups or is associated with a matrix containing positively charged groups. After rinsing, the sample is then brought into contact with the corresponding negatively charged matrix or modified material. This process continues with alternating deposition until the desired layer thickness is achieved. With solvent vapor deposition, empty spaces in a nanostructure can be filled with a polymer or other organic material (such as a small molecule, e.g., fullerene, pigment, or dye) at room temperature by lowering the glass transition temperature $T_g$ by exposing the polymer to solvent vapor while on or mixed with the nanostructured material. Exposing the organic material to solvent vapor results in intimate contact between the organic material and the nanostructured material without having to expose them to possibly detrimental heat. Solution processing methods need only to be employed to create bulk films while infiltration can take place in the solid state after depositing the film. Solvent vapor deposition is described in commonly-assigned, U.S. patent application Ser. No. 10/719,041, filed Nov. 21, 2003, the disclosures of which are incorporated herein by reference.].

Figure 5:
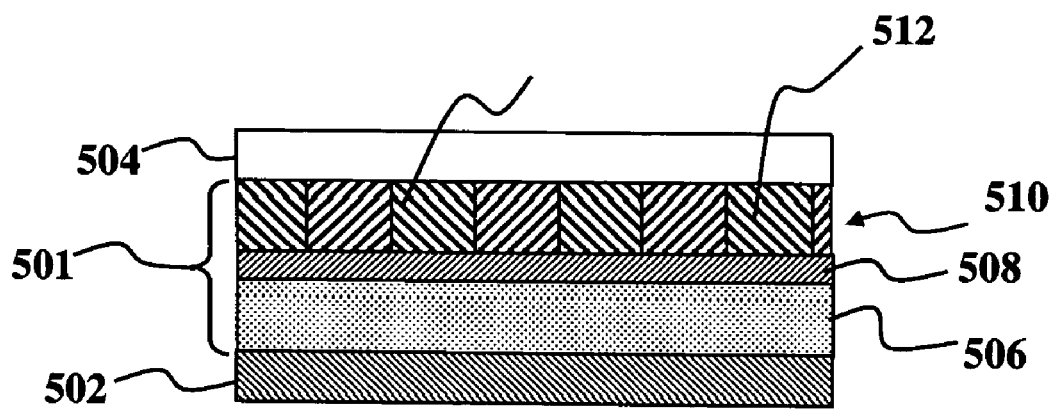
FIG. 5 is a cross-sectional schematic diagram of a photovoltaic device having a photovoltaic apparatus according to an alternative embodiment of the present invention.

Although FIG. 2 and FIG. 3 depict energy transfer layers having a cascaded sequence of HOMO and LUMO levels, other embodiments of the invention can be implemented without such cascading. For example, two or more different light-absorbing and exciton-generating materials may interpenetrate with each other within the same layer. In such a case, the upper absorbing layers need not have the cascading sequence of LUMO and HOMO levels with respect to each other so long as they each have cascading HOMO and LUMO levels with respect to a lower absorbing layer. FIG. 5 depicts an example of a device structure for a photovoltaic device 500 according to another alternative embodiment of the present invention. The device 500 generally includes an active layer 501 disposed between a base electrode 502 and a transparent electrode 504. The active layer 501 includes an acceptor layer 506 and two or more energy transfer layers including a lower energy transfer layer 508 and an upper (light-absorbing) energy transfer layer 510 having two or more light-absorbing materials 511, 512.

In this embodiment, the light-absorbing materials 511, 512 are present in the upper energy transfer layer 510 in an interpenetrating fashion. The materials interpenetrate within the plane of the upper absorbing layer but are continuous in a direction perpendicular to the plane. Charge can transfer between the upper absorbing materials and the lower energy transfer layer 508. Charge transfer need not take place amongst the light-absorbing materials 511, 512. The upper light-materials 511, 512 are characterized by spectral overlap and larger bandgap than the lower layer 508. Consequently, the light-absorbing materials 511, 512 are configured for Förster energy transfer with the lower layer 508 as described above with respect to FIG. 1-FIG. 2. The light-absorbing materials 511, 512 need not be configured for Förster energy transfer with each other, although they may be if desired. The presence of the light-absorbing materials 511, 512 may alternate within the upper energy transfer layer 510 on a scale of distance between about 1 nm and about 3 microns. Although only two light-absorbing materials 511, 512 are depicted for the sake of example, those of skill in the art will recognize that the active layer 501 may include three or more light-absorbing layers as necessary to provide the desired spectral range for absorption of light.

The interpenetrating structure can be obtained, e.g. by a process involving selective deposition and/or removal of the light-absorbing materials 511, 512 or with the use of a removable template. Examples of techniques for fabrication of such structures are described e.g., in commonly-assigned U.S. patent application Ser. No. 10/303,665, filed Nov. 22, 2002, U.S. patent application Ser. No. 10/771,250, filed Feb. 2, 2004, U.S. patent application Ser. No. 10/771,092, filed Feb. 2, 2004, U.S. patent application Ser. No. 10/781,081, filed Feb. 17, 2004, the disclosures of all of which are incorporated herein by reference. For organic materials, solvent vapor annealing may be used as described above to facilitate formation of multiple layers.

The acceptor layer 506, lower energy transfer layer 508 and light-absorbing materials 511, 512 may be made of any of the materials described above with respect to FIG. 3 for the acceptor layer 306 and absorbing layers 308, 310. As described above, the lower energy transfer layer 508 (i.e., the one closest to the acceptor layer 506) has a thickness that is less than or equal to an exciton diffusion distance for the lower absorbing layer 508. The light-absorbing materials 511, 512 are thicker, e.g., greater than the appropriate exciton diffusion distance and less than about 60 nm, for the reasons described above. The acceptor layer 506 has HOMO and LUMO levels configured so that charge splitting takes place at the interface with the lower energy transfer layer 508 but Förster energy transfer does not take place between the lower energy transfer layer 508 and the acceptor layer 506.

Figure 6:
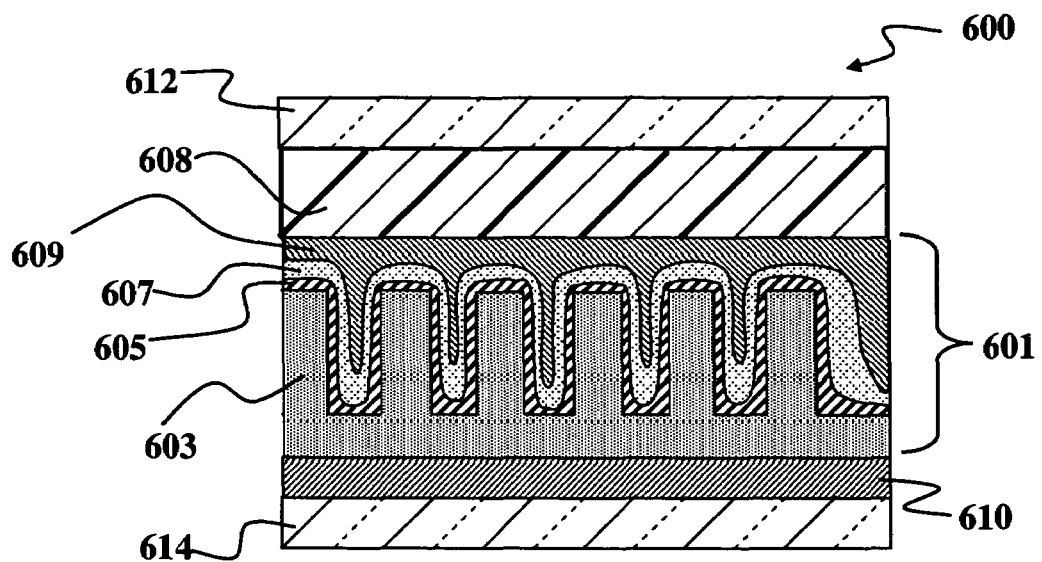
FIG. 6 is a cross-sectional schematic diagram of a photovoltaic device having a photovoltaic apparatus according to another alternative embodiment of the present invention.

FIG. 6 depicts an example of a device structure for a photovoltaic device 600 according to another alternative embodiment of the present invention. The device 600 generally includes an active layer 601 having an acceptor layer 603 and two or more energy transfer layers including a lower energy transfer layer 605 and one or more upper (light-absorbing) absorbing energy transfer layers 607. The energy transfer layers 605, 607 are characterized by spectral overlap and cascaded bandgap and configured for Förster energy transfer as described above with respect to FIG. 1-FIG. 3. The upper energy transfer layer 607 preferably has light absorbing and exciton-generating properties. The lower energy transfer layer 605 need not but may optionally have light-absorbing and exciton generating properties. The acceptor layer 603 has HOMO and LUMO levels configured so that charge splitting takes place at the interface with the lower energy transfer layer 605 but Förster energy transfer does not take place between the lower energy transfer layer and the acceptor layer 603. The acceptor layer 603 and energy transfer layers 605, 607 may be made of any of the materials described above with respect to FIG. 3 for the energy transfer layers 308, 310 and acceptor layer 306. Although only two energy transfer layers 603, 605 are depicted for the sake of example, those of skill in the art will recognize that the active layer 601 may include three or more energy transfer layers as necessary to provide the desired spectral range for absorption of light.

As described above, the lower energy transfer layer 605 (i.e., the one closest to the acceptor layer 603) has a thickness that is less than or equal to an exciton diffusion distance for the lower energy transfer layer 605. The lower energy transfer layer 605 may or may not have light-absorbing, exciton-generating properties. The upper (light-absorbing) energy transfer layers 607 are thicker, e.g., greater than the appropriate exciton diffusion distance and less than about 60 nm, for the reasons described above. In this embodiment, the acceptor layer 603 and/or energy transfer layers 605, 607 exhibit a three-dimensional structure such that for a given cross-section of the active layer 601, the presence the different absorber layers and/or the acceptor layer varies on a scale of length between a few tens of nanometers and a few microns.

The three-dimensional structuring of the energy transfer layers increases the effective light absorption of the active layer compared to a flat absorber layer covering a space of the same length and width. One of the layers 603, 605, 607 may be formed with the desired three-dimensional structure and another layer formed over it. In the example depicted in FIG. 6, the acceptor layer exhibits a three-dimensional structure over which the energy transfer layers are formed in a more or less conformal fashion. Alternatively, the layers 603, 605, 607 may be formed sequentially over a structured template in a more or less conformal fashion. There are various ways of producing three-dimensional structured layers of the desired scale. See, for example, US Published Patent Application 20040084080 A1, and U.S. patent application Ser. Nos. 10/303,665, 10/443,456, and 10/781,081, the disclosures of all of which are incorporated herein by reference.

In addition, inorganic energy transfer materials may be deposited within ordered template substrates having for example arrays of nanotubes. If the nanotubes are sufficiently small, each will on average typically contain either a single-crystalline grain or a small number of crystalline grains of active layer material, with the majority of the surface area of these grains in contact with the wall of the template rather than with other grains. In this manner the grains will form more heterojunctions than homojunctions, which, depending upon the choice of composition of template wall material, can be used to tune the performance features of the cells. Examples of such polycrystalline templating techniques are described in commonly-assigned U.S. patent application Ser. No. 10/829,928, filed Apr. 21, 2004, the disclosures of which are incorporated herein by reference.

The energy transfer layers may be incorporated into spaces between the three-dimensional features in the active layer 601 in any suitable way. For example, a sequence of conformal depositions may be used. Where the layers 603, 605, 607 are organic materials, these layers may be formed by solution deposition and incorporated into the three-dimensional structure by forming a relatively flat polymer layer over the 3D structure and then melting the flat layer to incorporate it into the structures. To avoid potentially detrimental heating, empty spaces in the 3D structure can be filled with a polymer or other organic material (such as a small molecule, e.g., fullerene, pigment, or dye) at room temperature by lowering the glass transition temperature $T_g$ by exposing the polymer to solvent vapor while on or mixed with the nanostructured material. Such solvent vapor infiltration is described in detail in commonly-assigned U.S. patent application Ser. No. 10/719,041, which is incorporated herein by reference. Solvent vapor annealing may be used between depositions of different layers as described above. These techniques may also be used in forming a device of the type depicted in FIG. 5.

The active layer 601 may be disposed between a transparent conducting electrode (TCE) 608 and a base electrode 610. The TCE 608 may be a layer of transparent conducting oxide (TCO) such as indium tin oxide (ITO). The TCE 608 may optionally include (either with or without a TCO) some combination of a transparent conducting polymer, a thin metal layer or an array of spaced apart wires, e.g., in the form of a mesh, grid or parallel wires. The base electrode 610, may be in the form of a commercially available sheet material such as such as C-, Au-, Ag-, Al-, or Cu-coated Steel Foil or metal/alloy-coated plastic foils, including metal or metalized plastic substrates/foils that are planarized to reduce surface roughness. For example, the metal foils could be made of aluminum, stainless steel, titanium, molybdenum, or alloys of these and/or related materials. The base electrode 610 may optionally be a TCE.

A light transmitting (i.e., transparent, or at least translucent) conductive or semiconductive material 609 may be disposed between the energy transfer layers and the TCE 608 to facilitate electrical contact. The material 609 may be a conductive oxide such as indium tin oxide, tin oxide, fluorine-doped tin oxide, zinc oxide, aluminum-doped zinc oxide, combinations of such layers; a liquid electrolyte, solid electrolyte (such as a doped, high bandgap conjugated polymer such as PAM or PEDOT), an ionic gel, ionic liquid or ionic solid. Combinations of these materials and/or similar materials can also be used.

The device 600 may be modularized by well-known encapsulation in order to improve weather resistance and mechanical strength e.g., with an optional substrate and/or encapsulant layers 612, 614. The optional encapsulant layers 612, 614 protect the device 600 from the surrounding environment. The encapsulants 612, 614 may also absorb UV-light to protect organic materials disposed between the encapsulants 612, 614. Examples of suitable encapsulant materials include one or more layers of polymers, such as tetrafluoroethylene-hexafluoropropylene—vinylidenflouride—copolymer (THV), polyethylene terephthalate (PET), ethylene vinyl acetate (EVA), and/or Mylar®. Mylar is a registered trademark of E. I. du Pont de Nemours and Company of Wilmington, Del. Inorganic materials, such as glass and plastic foils, metalized plastic foils, and metal foils may also be used for the encapsulant layer. The encapsulant layer may also include nitrides, oxides, oxynitrides or other inorganic materials. Alternatively, the encapsulants may include Tefzel® (DuPont), tefdel, thermoplastics, polyimides, polyamides, nanolaminate composites of plastics and glasses (e.g. barrier films such as those described in commonly-assigned, co-pending U.S. patent application Ser. No. 10/698,988, to Brian Sager and Martin Roscheisen, filed Oct. 31, 2003, and entitled "INORGANIC/ORGANIC HYBRID NANOLAMINATE BARRIER FILM", which is incorporated herein by reference), and combinations of the above. Such encapsulation may also be used for the devices of the types described above with respect to FIG. 3 and FIG. 5.

FIGS. 7A-7D depict devices 700A, 700C that are variations on the embodiment depicted in FIG. 6. As shown FIGS. 7A-7B the device 700A has a nanostructured active layer 701. In the active layer 701 an acceptor layer 703 exhibits a three-dimensional structure having voids. Such a structure may be formed, e.g., as described above. A lower energy transfer layer 705 coats the three-dimensional structure of the acceptor layer 703 an upper energy transfer material 707 fills portions of the voids not occupied by the lower energy transfer material. The lower energy transfer layer and upper energy transfer material are characterized by spectral overlap suitable for Förster energy transfer as described above. The lower energy transfer layer 705 forms a thin layer, e.g., having a thickness less than the exciton diffusion length as described above. Due to the nanostructuring of the acceptor layer 703 presence of the lower energy transfer layer, the upper energy transfer material and/or the acceptor layer varies on a scale of length between a few tens of nanometers and a few microns.

The acceptor layer 703 is in electrical contact with a lower electrode 710 and both the lower energy transfer layer 705 and upper energy transfer material 707 are in contact with an upper electrode 708. FIG. 7B illustrates a cross-sectional view looking down from the interface with the upper electrode. Note that for a photovoltaic device either the upper electrode 708, the lower electrode 710 or both may be transparent. Since both the lower energy transfer layer and the upper energy transfer material make contact with the electrode holes can escape directly to the upper electrode 708. As long as the upper and lower energy transfer materials exhibit spectral overlap suitable for Förster energy transfer, cascading of HOMO/LUMO levels (or valence/conduction band levels) is not required.

Figure 7A:
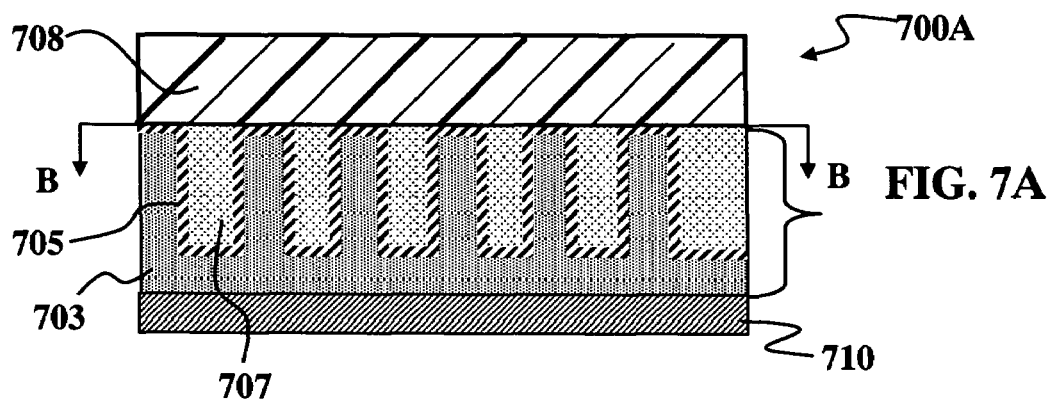
FIG. 7A is a vertical cross-sectional schematic diagram of a photovoltaic device having a photovoltaic apparatus according to another alternative embodiment of the present invention.
Figure 7B:
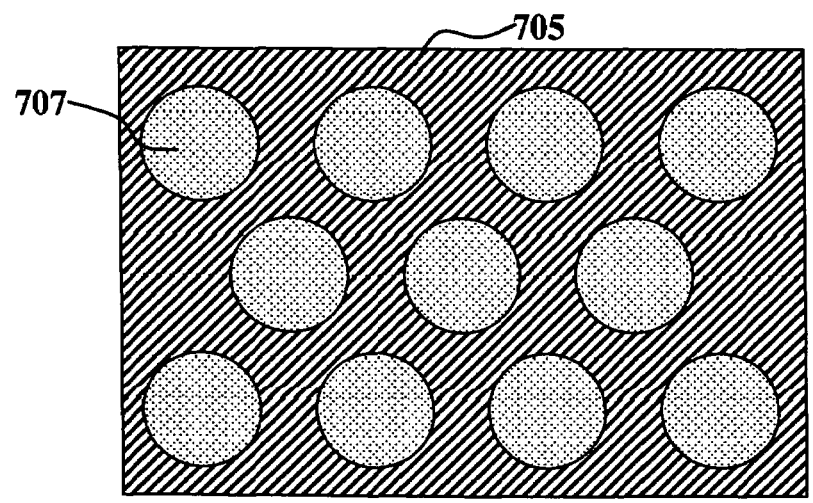
FIG. 7B is a horizontal cross-section taken along line B-B of FIG. 7A.
Figure 7C:
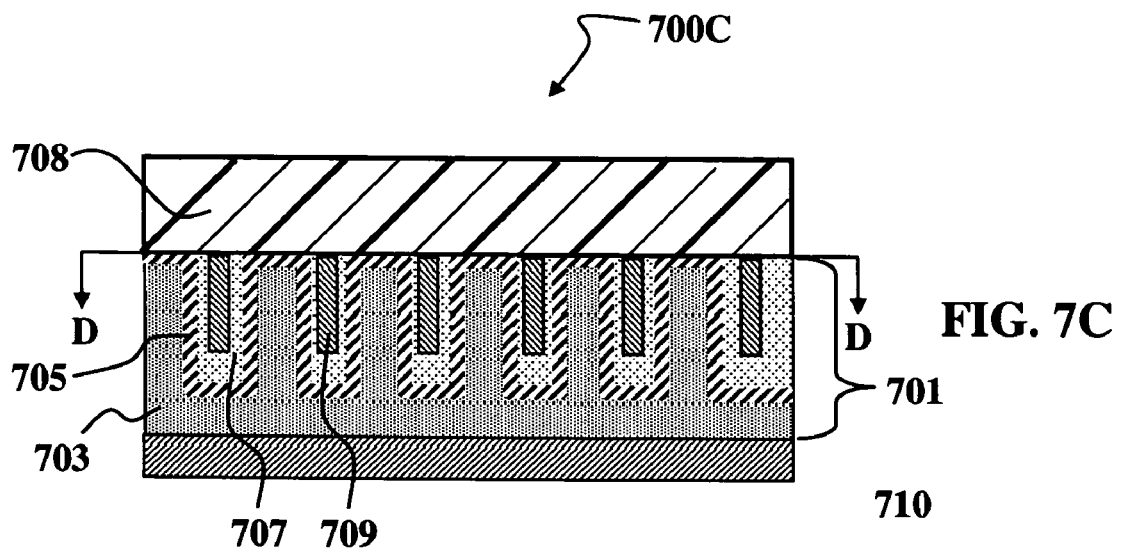
FIG. 7C is a vertical cross-sectional schematic diagram of a photovoltaic device having a photovoltaic apparatus according to another alternative embodiment of the present invention.
Figure 7D:
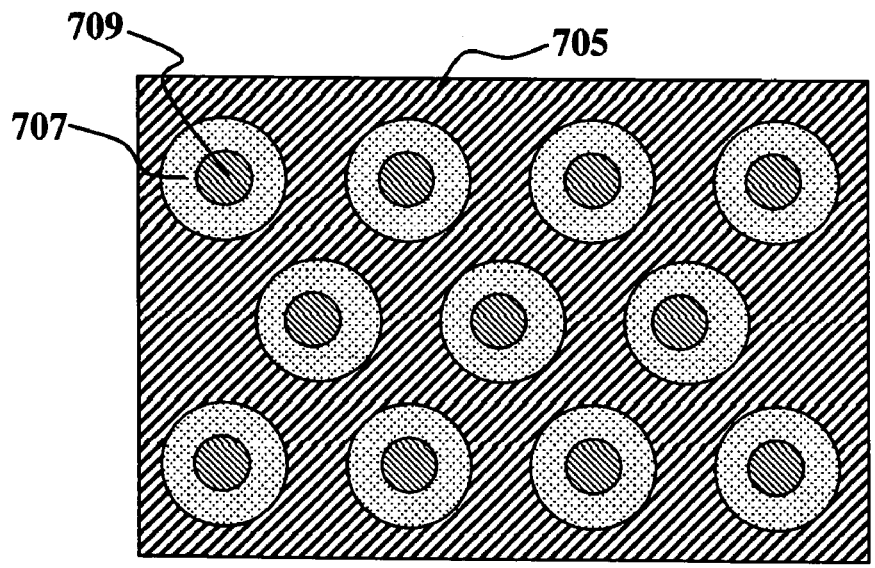
FIG. 7D is a horizontal cross-section taken along line D-D of FIG. 7C.

Although a single upper charger transfer material is shown in FIGS. 7A-7B for the sake of simplicity, the concept can be readily extended to structures having two or more upper charge transfer materials. For example, FIGS. 7C-7D illustrate a device 700C that is a variation on the device 700A of FIGS. 7A-7B. The devices 700A and 700C have essentially the same structure except that an additional upper charge transfer material 709 fills space in the voids not occupied by the lower energy transfer layer 705 and upper charge transfer material 707. The upper charge transfer materials 707, 709 are characterized by spectral overlap that allows Förster energy transfer to the additional upper charge transfer material 709. Note also that both upper charge transfer materials 707, 709 are in contact with the upper electrode 708.

Embodiments of the present invention provide for organic, inorganic, or organic/inorganic hybrid photovoltaic devices that are highly effective at energy transfer light over a range of wavelengths, converting absorbed light to excitons, splitting the excitons and collecting electrons and holes from the excitons. Such devices may have some relatively thick energy transfer layers while overcoming the problems of limited diffusion distance within those layers. Förster energy transfer provides a quantum mechanical mechanism for transferring excitons over relatively large distances without the excitons having to diffuse. Such devices may be fabricated relatively easily and inexpensively on a large scale thereby reducing the cost of electric power generated by these devices.

In hybrid photovoltaic devices according to the above-described embodiments of the present invention both organic and inorganic materials may be used together in the active layer as the acceptor layer and/or energy transfer layers or materials. In such a hybrid organic/inorganic active layer Förster energy transfer may move excitons from an organic material to an inorganic material or vice versa. Examples of hybrid organic/inorganic active layers are described in commonly-assigned U.S. patent Ser. No. 10/319,406, filed Dec. 11, 2002, the disclosures of which are incorporated herein by reference and commonly-assigned U.S. patent application Ser. No. 10/443,456, filed May 21, 2003, the disclosures of which were incorporated by reference above.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A photovoltaic apparatus, comprising:
an acceptor layer; a lower energy transfer layer; and a plurality of upper energy transfer materials, wherein the lower energy transfer layer is disposed between the acceptor layer and the plurality of energy transfer materials,
wherein the upper energy transfer materials each have a bandgap that is higher than a bandgap of the lower energy transfer layer, and wherein there is a spectral overlap between an absorption band of the lower energy transfer layer and an emission band of one or more of the upper energy transfer materials, whereby excitons can transfer from the upper energy transfer materials to the lower energy transfer layer by Förster energy transfer,
wherein the electronic levels of the lower energy transfer layer and acceptor layer are configured such that exciton splitting can take place at an interface between the lower energy transfer layer and the acceptor layer,
wherein each of the upper energy transfer materials is characterized by a thickness that is greater than an exciton diffusion distance for that material,
wherein the lower energy transfer layer has a thickness that is less than or equal to an exciton diffusion distance for the first energy transfer layer;
wherein the upper energy transfer materials are arranged by molecular orbital levels in a cascading configuration to create cascading energy transfer events to transfer exitons from the upper energy transfer layers toward the lower energy transfer layer via Förster energy transfer.

2. The apparatus of claim 1 wherein the bandgaps of the lower energy transfer layer and upper energy transfer materials are configured such that the lower energy transfer layer and each upper energy transfer layer can absorb ranges over different wavelength ranges.

3. The apparatus of claim 2 wherein the plurality of upper energy transfer materials are a sequence of upper energy transfer layers.

4. The apparatus of claim 2 wherein a given upper energy transfer layer has a bandgap that is higher than the bandgap of the lower energy transfer layer and higher than a bandgap for any other upper energy transfer layer between the lower energy transfer layer and the given upper energy transfer layer and wherein a lowest occupied molecular orbital (LUMO) level and a highest occupied molecular orbital (HOMO) level of the lower and upper energy transfer layers cascade so that excitons may be transferred from the upper energy transfer layers toward the lower energy transfer layer via Förster energy transfer.

5. The apparatus of claim 4 wherein the upper and lower energy transfer layers are substantially flat layers.

6. The apparatus of claim 4 wherein one or more of the acceptor layer, the lower energy transfer layer and the upper energy transfer layers form an active layer that exhibits a three-dimensional structure such that for a given cross-section of the active layer the presence of the upper and lower energy transfer layers and/or the acceptor layer varies on a scale of length between a few tens of nanometers and a few microns.

7. The apparatus of claim 4 wherein a relative orientation of dipoles in adjacent energy transfer layers is between about 0.67 and 1.0.

8. The apparatus of claim 2 wherein a given upper energy transfer layer is an inorganic material having a bandgap that is higher than the bandgap of the lower energy transfer layer and higher than a bandgap for any other upper energy transfer layer between the lower energy transfer layer and the given upper energy transfer layer and wherein a conduction band level and a valence band level of the lower and upper energy transfer layers cascade so that excitons may be transferred from the upper energy transfer layers toward the lower energy transfer layer via Förster energy transfer.

9. The apparatus of claim 1 wherein one or more of the lower energy transfer layer and the upper energy transfer materials include a conjugated polymer material.

10. The apparatus of claim 9 wherein the conjugated polymer material is a polythiophene with a side group that leaves when heated.

11. The apparatus of claim 9 wherein conjugated polymer includes one or more substituents that tune the HOMO and LUMO energy levels of the conjugated polymer.

12. The apparatus of claim 1 further comprising a first electrode and a second electrode wherein the acceptor layer, lower energy transfer layer and upper energy transfer materials are between the first and second electrodes.

13. The apparatus of claim 12, wherein the acceptor layer exhibits a three-dimensional structure having voids, wherein the lower energy transfer layer coats the three-dimensional structure, and wherein the plurality of upper energy transfer materials fills portions of the voids not occupied by the lower energy transfer layer.

14. The apparatus of claim 13 wherein for a given cross-section of the active layer the presence of the upper energy transfer material and the lower energy transfer layer and/or the acceptor layer varies on a scale of length between a few tens of nanometers and a few microns.

15. The apparatus of claim 13 wherein the acceptor layer is in electrical contact with the first electrode and wherein the lower energy transfer layer and one or more of the upper energy transfer materials are in contact with the second electrode.

16. The apparatus of claim 13 wherein one or more of the first and second electrodes is a transparent electrode.

17. The apparatus of claim 1 wherein the upper energy transfer materials include two or more upper energy transfer materials that are present in a single layer.

18. The apparatus of claim 17 wherein the presence of the two or more upper energy transfer materials alternates in the single layer on a scale of distance between about 1 nm and about 3 microns.

19. The apparatus of claim 1 wherein the acceptor layer, lower energy transfer material and upper energy transfer material are a combination of organic and inorganic materials configured such that Förster energy transfer can move excitons from an organic material to an inorganic material or vice versa.

20. The apparatus of claim 3 wherein each of the upper energy transfer layers between 10 nm and 60 nm are thick.

* * * * *